US007642605B2

(12) United States Patent
Takeguchi et al.

(10) Patent No.: US 7,642,605 B2
(45) Date of Patent: Jan. 5, 2010

(54) SEMICONDUCTOR DEVICE

(75) Inventors: Toru Takeguchi, Hyogo (JP); Kazuyuki Sugahara, Hyogo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/054,384

(22) Filed: Feb. 10, 2005

(65) Prior Publication Data
US 2005/0173763 A1 Aug. 11, 2005

(30) Foreign Application Priority Data
Feb. 10, 2004 (JP) .............................. 2004-033875

(51) Int. Cl.
H01L 23/62 (2006.01)
(52) U.S. Cl. ................... 257/381; 257/213; 257/51; 257/E31.043; 257/E29.003; 257/E29.292; 257/E21.572
(58) Field of Classification Search ........... 257/66, 257/67, 68, 69, 347, 344, 223, 291–292, 257/227, 213, 288, 368, 379, 381, 51, 439, 257/443, 655, E31.043, E29.003, E29.292, 257/E21.572
See application file for complete search history.

(56) References Cited

U.S. PATENT DOCUMENTS

| 4,746,961 | A | * | 5/1988 | Konishi et al. ............... 257/61 |
| 5,140,391 | A | * | 8/1992 | Hayashi et al. ............. 257/365 |
| 5,563,426 | A | * | 10/1996 | Zhang et al. ................. 257/66 |
| 5,620,910 | A | | 4/1997 | Teramoto |
| 5,837,568 | A | | 11/1998 | Yoneda et al. |
| 6,232,158 | B1 | * | 5/2001 | Lee ............................. 438/160 |
| 6,933,241 | B2 | * | 8/2005 | Shiraishi et al. ............ 438/713 |

| 2001/0034087 | A1 | * | 10/2001 | Zhang et al. ................. 438/154 |

(Continued)

FOREIGN PATENT DOCUMENTS

JP   1-107516   4/1989

(Continued)

OTHER PUBLICATIONS

S. Wolf and R.N Tauber, "Silicon processing for the VLSI Era", 1986, Lattice Press, vol. 1: Process Technology,246-247.*

(Continued)

*Primary Examiner*—W. David Coleman
*Assistant Examiner*—Su C Kim
(74) *Attorney, Agent, or Firm*—Buchanan Ingersoll & Rooney PC

(57) ABSTRACT

A semiconductor device includes a glass substrate having a main surface, a polysilicon film formed on the main surface, having a channel region formed and having a source region and a drain region formed on opposing sides of the channel region, a gate insulating film provided so as to be in contact with the polysilicon film and containing oxygen, and a gate electrode provided in a position facing the channel region with the gate insulating film being interposed. The polysilicon film has a thickness larger than 50 nm and not larger than 150 nm. The polysilicon film contains hydrogen in a proportion not smaller than 0.5 atomic percent and not larger than 10 atomic percent. With such a structure, a semiconductor device attaining a large drain current and having a desired electric characteristic is provided.

18 Claims, 9 Drawing Sheets

U.S. PATENT DOCUMENTS

| | | | |
|---|---|---|---|
| 2003/0010980 A1* | 1/2003 | Yamazaki et al. | 257/65 |
| 2003/0020118 A1* | 1/2003 | Kajiwara et al. | 257/347 |
| 2003/0122132 A1* | 7/2003 | Yamazaki | 257/72 |
| 2003/0183857 A1* | 10/2003 | Korenari | 257/288 |
| 2003/0232465 A1* | 12/2003 | Hayakawa | 438/151 |
| 2004/0038465 A1* | 2/2004 | Shimomura et al. | 438/166 |
| 2004/0238820 A1* | 12/2004 | Sakama et al. | 257/59 |

FOREIGN PATENT DOCUMENTS

| | | | |
|---|---|---|---|
| JP | 8-153699 | | 6/1996 |
| JP | 09-160072 | | 6/1997 |
| JP | 11-163356 | | 6/1999 |
| JP | 2000-260731 | | 9/2000 |
| JP | 2001-223366 A | | 8/2001 |
| JP | 2001-264813 | * | 9/2001 |
| JP | 2001-345448 | | 12/2001 |
| JP | 2002-64209 | | 2/2002 |
| JP | 2002-064209 | * | 2/2002 |
| JP | 2002-299234 | | 10/2002 |
| JP | 2005-57042 A | | 3/2005 |
| JP | 2005-72350 | | 3/2005 |
| JP | 2005-79319 | | 3/2005 |
| KR | 1996-0002901 | | 1/1996 |
| KR | 1996-0012576 | | 4/1996 |
| KR | 1998-0038871 | | 8/1998 |
| KR | 1999-0012566 | | 2/1999 |
| KR | 2001-0039906 | | 5/2001 |

OTHER PUBLICATIONS

Notice of Allowance dated Sep. 6, 2007.

* cited by examiner

SEMICONDUCTOR DEVICE

BACKGROUND OF THE INVENTION

1. Field of the Invention

The present invention generally relates to a semiconductor device, and more particularly to a thin film transistor (TFT) used, for example, in a display device.

2. Description of the Background Art

For example, Japanese Patent Laying-Open No. 2001-345448 discloses a conventional thin film transistor and a manufacturing method thereof The thin film transistor disclosed in this publication includes an alkali-free glass substrate, a silicon nitride film formed on the glass substrate, a polycrystalline silicon film formed on the silicon nitride film and having a channel region and a source/drain region formed in the film, a gate electrode formed with a silicon oxide film (a gate insulating film) provided on the polycrystalline silicon film being interposed, and an insulating layer implemented by an silicon oxide layer formed so as to cover the gate electrode. The insulating layer has a contact hole reaching the source/drain region formed, and a metal serving as a source/drain electrode fills the contact hole.

The polycrystalline silicon film included in the thin film transistor is formed in the steps of initially forming an amorphous silicon film on the glass substrate and thereafter polycrystallizing the amorphous silicon film by instantaneous heating using excimer laser. The polycrystalline silicon film thus obtained has a thickness of 50 nm.

An operation of the thin film transistor will now be described. When the thin film transistor is of an n-type, for example, a drain current flows between the drain region and the source region by applying a positive voltage (5V, for example) to each of the gate electrode and the drain electrode and by connecting the source electrode to the ground.

Meanwhile, Japanese Patent Laying-Open No. 2000-260731 discloses a laser heat treatment method aiming to form a polycrystalline silicon film having excellent crystallinity, in order to implement a thin film transistor attaining high mobility.

In the thin film transistor disclosed in Japanese Patent Laying-Open No. 2001-345448, the polycrystalline silicon film having the channel region and the source/drain region provided is as thin as 50 nm. Accordingly, the region through which the drain current flows at the time of operation of the thin film transistor is limited within the small-thickness film. Therefore, in the n-type thin film transistor having a gate width of 10 μm, for example, an ON current (the drain current that flows when a voltage of 5V is applied to each of the gate electrode and the drain electrode) of 0.1 mA is merely obtained, which is unsatisfactorily low.

In addition, when the polycrystalline silicon film has a small thickness, a contact hole may be formed in such a manner as to penetrate the polycrystalline silicon film in forming the contact hole in the insulating layer. Here, the source/drain electrode and the polycrystalline silicon film come in contact with each other solely along side surfaces of respective electrodes. Moreover, when the polycrystalline silicon film has a small thickness, a concentration of an impurity in the film cannot be set to a high value if destruction of crystals of the polycrystalline silicon film should be avoided at the time of ion injection. For these reasons, the thin film transistor disclosed in Japanese Patent Laying-Open No. 2001-345448 is disadvantageous in that a contact resistance between the source/drain electrode and the polycrystalline silicon film is increased.

On the other hand, when the polycrystalline silicon film with a large thickness is formed, dangling bonds in the film are increased, although the above-described problem is solved. This will cause another disadvantage of a poorer transistor characteristic. In addition, when the gate insulating film is formed to cover the polycrystalline silicon film, performance in covering the polycrystalline silicon film with the gate insulating film is deteriorated. A desired transistor characteristic cannot be obtained either.

SUMMARY OF THE INVENTION

An object of the present invention is to solve the above-described problems, as well as to provide a semiconductor device attaining a large drain current and a desired electric characteristic by controlling a thickness of a semiconductor film such that the thickness is set within an appropriate range.

A semiconductor device according to the present invention includes: a substrate having a main surface; a semiconductor film provided on the main surface, having a channel region formed and having a source region and a drain region formed on opposing sides of the channel region; a gate insulating film provided so as to be in contact with the semiconductor film and containing oxygen; and a gate electrode provided in a position facing the channel region with the gate insulating film being interposed. The semiconductor film has a thickness larger than 50 nm and not larger than 150 nm. The semiconductor film contains hydrogen in a proportion not smaller than 0.5 atomic percent and not larger than 10 atomic percent.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
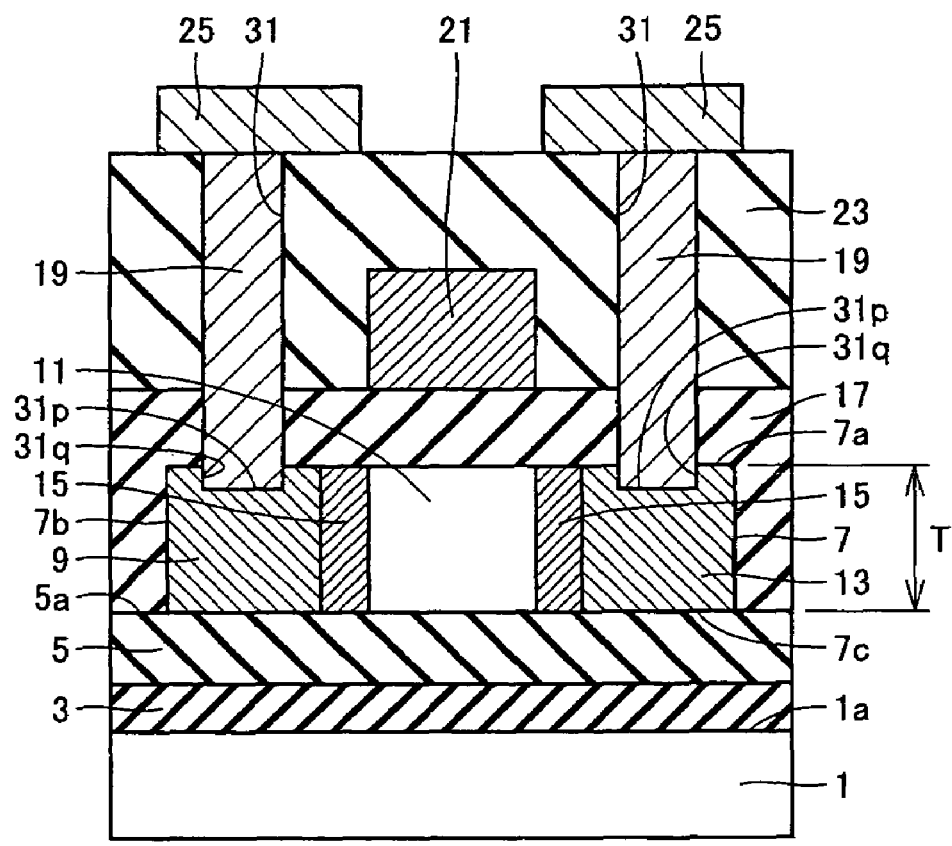
FIG. 1 is a cross-sectional view showing a semiconductor device according to a first embodiment of the present invention.

A semiconductor device shown in FIG. 1 represents an n-type thin film transistor used, for example, in a liquid crystal display (LCD).

Referring to FIG. 1, the semiconductor device includes a glass substrate 1 having a main surface 1a, an SiN (silicon nitride) film 3 and an $SiO_2$ (silicon oxide) film 5 successively stacked on main surface 1a, a polysilicon film 7 formed on a top surface 5a of $SiO_2$ film 5, a gate insulating film 17 formed on top surface 5a so as to cover polysilicon film 7, and a gate electrode 21 formed on gate insulating film 17. Polysilicon film 7 has a channel region 11 formed and has a source region 9 and a drain region 13 formed on opposing sides of channel region 11.

Polysilicon film 7 has a thickness T larger than 50 nm and not larger than 150 nm. In the present embodiment, the thickness is set to 100 nm. More preferably, polysilicon film 7 has a thickness T larger than 75 nm and not larger than 125 nm. Polysilicon film 7 contains hydrogen (H) in a proportion not smaller than 0.5 atomic percent and not larger than 10 atomic percent. In the present embodiment, polysilicon film 7 contains 2 atomic percent hydrogen.

An interlayer insulating film 23 is formed on gate insulating film 17 so as to cover gate electrode 21. Interlayer insulating film 23 and gate insulating film 17 have contact holes 31 formed, that open in the top surface of interlayer insulating film 23 and reach source region 9 and drain region 13 respectively. Contact plugs 19 being in contact with source region 9 and drain region 13 respectively fill contact holes 31. An interconnection 25 is formed on the top surface of interlayer insulating film 23 so as to be in contact with contact plug 19. Though not shown, interlayer insulating film 23 has a contact plug connecting gate electrode 21 to interconnection 25 also formed.

The product manufactured by Corning Incorporated, 1737, is used as glass substrate 1. Glass substrate 1 may be implemented by a quartz substrate. SiN film 3 and $SiO_2$ film 5 contain hydrogen. SiN film 3 has a thickness of 50 nm, while $SiO_2$ film 5 has a thickness of 200 nm. SiN film 3 and $SiO_2$ film 5 are provided as an underlying layer for polysilicon film 7, and the underlying layer preferably has a thickness not smaller than 200 nm.

The underlying layer is formed in order to supply polysilicon film 7 with hydrogen and also to prevent an impurity in glass substrate 1 from diffusing in polysilicon film 7. By setting the thickness of the underlying layer to 200 nm or larger, stable supply of hydrogen to polysilicon film 7 can be achieved. In addition, prevention of diffusion of the impurity into polysilicon film 7 can be ensured.

The underlying layer for polysilicon film 7 attaining such a function is not limited to SiN film 3 and $SiO_2$ film 5, and the underlying layer may be formed with a material such as SiON, SiC, AlN, $Al_2O_3$, and the like. In addition, though a two-layer structure has been described as the underlying layer by way of example, the present embodiment is not limited thereto. The underlying layer may not be formed, or alternatively, a structure including a greater number of layers may be adopted.

Polysilicon film 7 has a bottom surface 7c being in contact with top surface 5a of $SiO_2$ film 5 and a top surface 7a located opposite to bottom surface 7c and extending in parallel to bottom surface 7c. It is noted that thickness T of polysilicon film 7 described above is equal to a distance between top surface 7a and bottom surface 7c. Polysilicon film 7 further includes a side surface 7b continuing from top surface 7a to bottom surface 7c and extending substantially orthogonal to bottom surface 7c. A polycrystal constituting polysilicon film 7 has a grain size not smaller than 0.5 μm and not larger than 1 μm.

In polysilicon film 7, LDD (lightly doped drain) regions 15 are formed between channel region 11 and source region 9 and between channel region 11 and drain region 13 respectively. LDD region 15 is provided in such a position that LDD region 15 and gate electrode 21 do not overlap with each other when they are projected on main surface 1a. LDD region 15 is provided in order to relax electric field generated between channel region 11 and source region 9 and between channel region 11 and drain region 13. Source region 9, drain region 13, and LDD region 15 are formed from top surface 7a to bottom surface 7c of polysilicon film 7.

Source region 9 and drain region 13 contain phosphorus (P) serving as an electrically active impurity in a concentration of $10^{19}/cm^3$. LDD region 15 contains the impurity in a concentration lower than in source region 9 and drain region 13. In the present embodiment, phosphorus is contained in a concentration of $10^{16}/cm^3$. Phosphorus contained in source region 9 and drain region 13 is present across polysilicon film 7 having source region 9 and drain region 13 provided.

If the electric field should further be relaxed, a GOLD (gate overlapped lightly doped drain) region may be formed between channel region 11 and source region 9 and between channel region 11 and drain region 13. The GOLD region is provided in such a position that the GOLD region and gate electrode 21 overlap with each other when they are projected on main surface 1a. The GOLD region contains the impurity in a concentration lower than in source region 9 and drain region 13. In addition, both of LDD region 15 and the GOLD region may be formed in polysilicon film 7. Here, LDD region 15 contains the impurity in a concentration lower than in source region 9 and drain region 13, while the GOLD region contains the impurity in a concentration further lower than in LDD region 15.

Gate insulating film 17 is formed with an insulating material containing oxygen (O). In the present embodiment, gate insulating film 17 is formed with $SiO_2$. Gate insulating film 17 has a thickness of 80 nm in a position where gate insulating film 17 comes in contact with top surface 7a of polysilicon film 7. Gate electrode 21 is formed with Cr (chromium) and has a thickness of 200 nm. Interlayer insulating film 23 is formed with $SiO_2$ and has a thickness of 500 nm.

Contact hole 31 reaches polysilicon film 7. A bottom surface 31p and a portion 31q of a sidewall of contact hole 31 are defined by polysilicon film 7. Interconnection 25 is formed by a three-layered body consisting of Mo (molybdenum), Al (aluminum) and Mo. The three layers have thicknesses of 20 nm, 500 nm, and 20 nm, respectively.

It is noted that the material forming the film and its dimension mentioned above are shown by way of example, and the present invention is not limited thereto.

A manufacturing method of the semiconductor device shown in FIG. 1 will now be described with reference to FIGS. 2 to 9 and FIG. 1. For the sake of simplicity of description, it is assumed that LDD region 15 in FIG. 1 is not formed.

Figure 2:
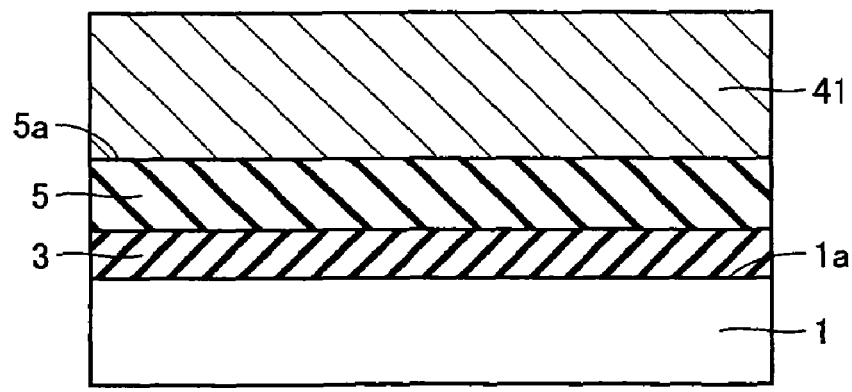
FIGS. 2 to 9 are cross-sectional views illustrating the steps in a method of manufacturing the semiconductor device shown in FIG. 1.

Referring to FIG. 2, SiN film 3, $SiO_2$ film 5, and an amorphous silicon film 41 are successively formed on main surface 1a of glass substrate 1 using plasma CVD (chemical vapor deposition). Amorphous silicon film 41 is formed to have a thickness larger than 50 nm and not larger than 150 nm. Then, B (boron) of a prescribed dose is injected to amorphous silicon film 41 using ion doping.

Heat treatment may be carried out after amorphous silicon film 41 is formed, such that concentration of H (hydrogen) contained in amorphous silicon film 41 is set to 2 atomic percent or lower. In this case, occurrence of a crack due to bumping of the amorphous silicon film in a subsequent laser annealing process can be prevented.

Figure 3:
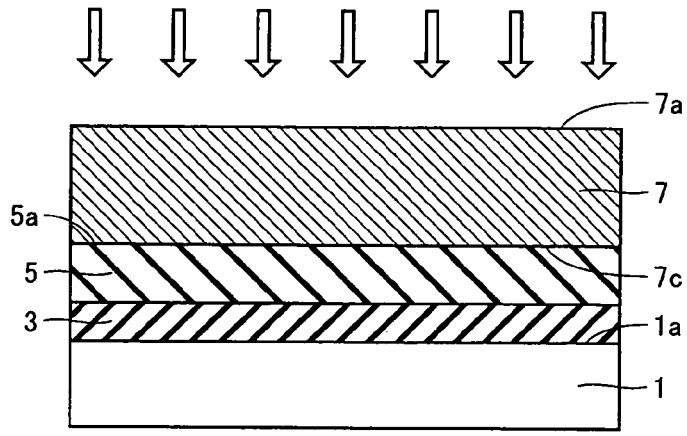

Referring to FIG. 3, amorphous silicon film 41 is irradiated with a laser beam of the second harmonics (wavelength of 532 nm) of YAG laser. Here, amorphous silicon film 41 is irradiated with the laser beam after it is converted to linear beam profile by passing through a prescribed optical system. The laser beam should have a wavelength not smaller than 350 nm and not larger than 800 nm. Polycrystallization of amorphous silicon film 41 and formation of polysilicon film 7 is thus achieved through the laser annealing process.

Though the YAG laser has been employed for polycrystallization of amorphous silicon film 41, the present embodiment is not limited thereto. For example, CW laser (continuous-wave laser) may be employed, or alternatively, thermal annealing may be performed. When thermal annealing is performed, a polysilicon film having a larger crystal size can be obtained with the use of a catalyst such as Ni (nickel).

Figure 4:
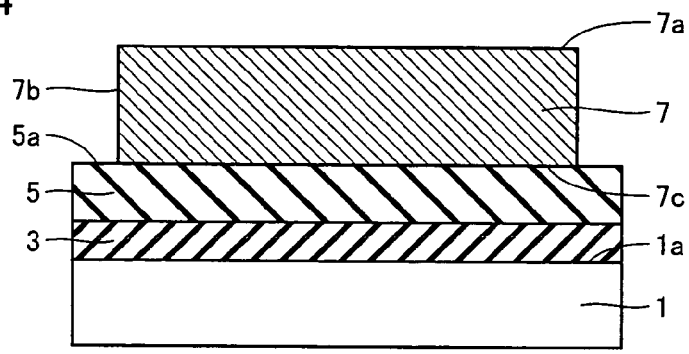

Referring to FIG. 4, a not-shown resist film having a prescribed opening pattern is formed on polysilicon film 7. Using this resist film as a mask, polysilicon film 7 is etched so that polysilicon film 7 has a prescribed shape. Thereafter, the resist film is removed by ashing.

Figure 5:
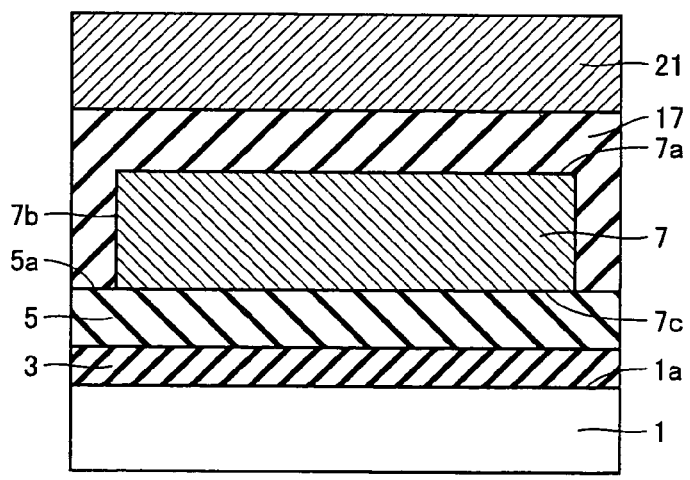
Figure 6:
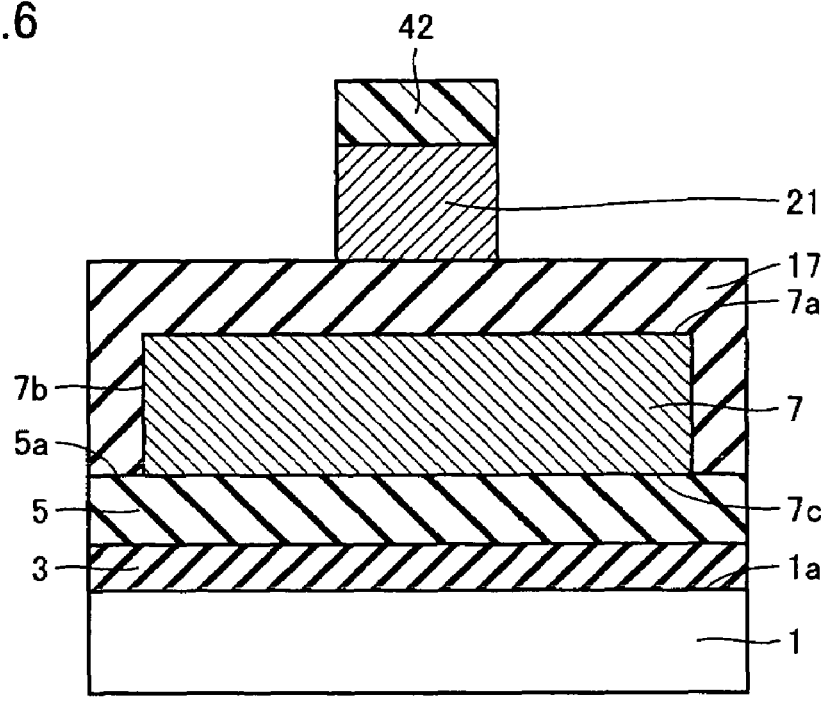

Referring to FIG. 5, gate insulating film 17 covering polysilicon film 7 is formed with plasma CVD. Then, a metal film for forming gate electrode 21 is formed on gate insulating film 17 with sputtering. Referring to FIG. 6, a resist film 42 having a prescribed opening pattern is formed on the metal film formed in the previous step. Using resist film 42 as a mask, the metal film is etched so as to form gate electrode 21.

Figure 7:
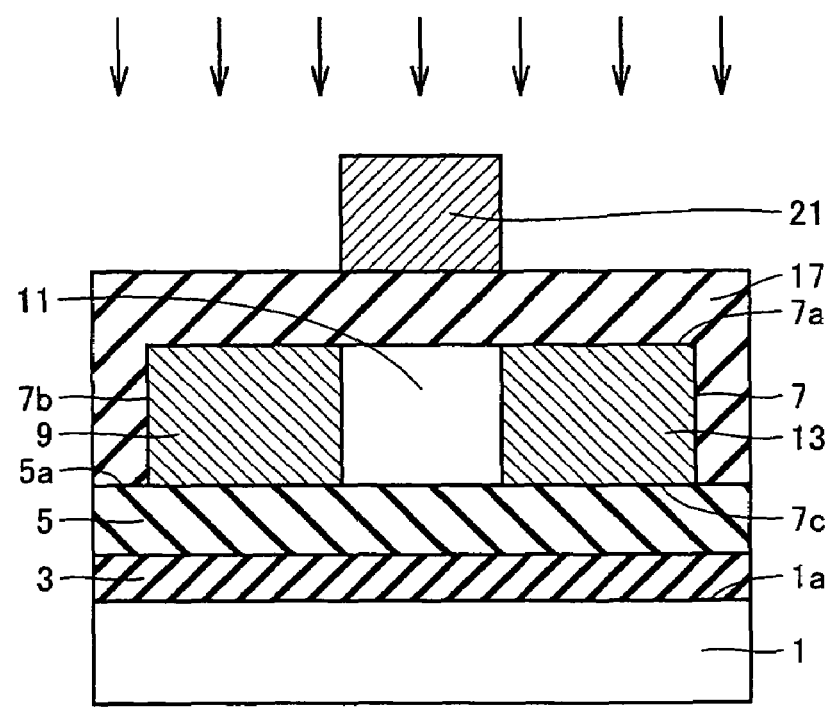

Referring to FIG. 7, resist film 42 is removed with ashing. Then, phosphorus of a prescribed dose is injected to polysilicon film 7 using ion doping. Here, phosphorus is injected to opposing ends of polysilicon film 7 with gate electrode 21 serving as a mask, so that source region 9 and drain region 13 are formed in polysilicon film 7.

Figure 8:
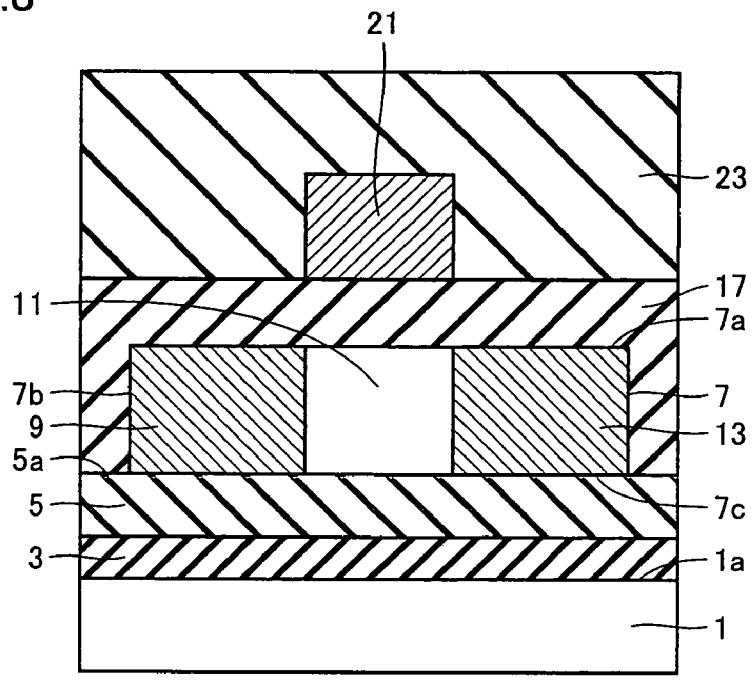
Figure 9:
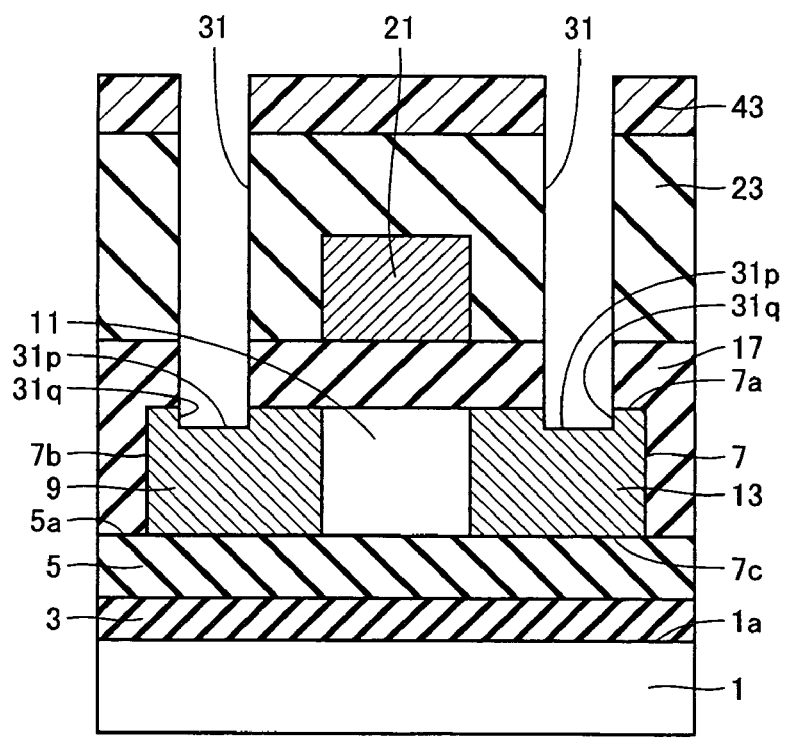

Referring to FIG. 8, interlayer insulating film 23 covering gate electrode 21 is formed on gate insulating film 17. Referring to FIG. 9, a resist film 43 having a prescribed opening pattern is formed on interlayer insulating film 23. Using resist film 43 as a mask, interlayer insulating film 23 and gate insulating film 17 are etched, so that contact holes 31 reaching source region 9 and drain region 13 respectively are formed.

Referring to FIG. 1, resist film 43 is removed with ashing. Then, contact plug 19 filling contact hole 31 is formed. Interconnection 25 having a prescribed shape is formed on interlayer insulating film 23. After interconnection 25 is formed, the semiconductor device is exposed to hydrogen plasma atmosphere for 30 minutes under the following condition: hydrogen flow rate of $3\times10^{-3}$ m$^3$/min (=3 SLM), RF power of 100 W, and a pressure of 100 Pa.

Finally, in order to terminate the dangling bonds in polysilicon film 7, heat treatment at a temperature of 300° C. for approximately 60 minutes is carried out in hydrogen atmosphere. With these process steps, a proportion of hydrogen contained in polysilicon film 7 is controlled in a range from at least 0.5 atomic percent to at most 10 atomic percent. In the present embodiment, the proportion of hydrogen is set to 2 atomic percent under the above-described condition. Through the process steps above, the semiconductor device in FIG. 1 is fabricated.

In the semiconductor device shown in FIG. 1 fabricated as above, as polysilicon film 7 has thickness T larger than 50 nm, a larger ON current can be obtained. In addition, as polysilicon film 7 has thickness T not larger than 150 nm, significant deterioration in a subthreshold characteristic is avoided. In the following, this feature will be described in detail with reference to an example.

In the semiconductor device shown in FIG. 1, a magnitude of the drain current flowing between source region 9 and drain region 13 was measured under such a condition that a gate voltage and a drain voltage to be applied to gate electrode 21 and drain region 13 respectively were set to 5V. Polysilicon film 7 had a thickness of 100 nm and a gate width of 10 µm. As a result, the drain current of 0.18 mA was measured, and it was confirmed that a relatively large ON current was obtained.

In this manner, when polysilicon film 7 has thickness T larger than 50 nm, a region (area) where the drain current flows is increased, which leads to increase in the ON current. For the following reason, however, polysilicon film 7 cannot have thickness T larger than 150 nm.

Normally, the subthreshold characteristic serves as an indicator for representing the transistor performance. The subthreshold characteristic is evaluated with an S (subthreshold) coefficient representing an increment of the gate voltage required for increasing the order of magnitude of the drain current by one in a region where the gate voltage is not larger than the threshold. As the S coefficient is smaller, the subthreshold characteristic is determined as better. Here, a test in which the S coefficient and the drain current were measured for various thicknesses of polysilicon film 7 in FIG. 1 was conducted.

Figure 10:
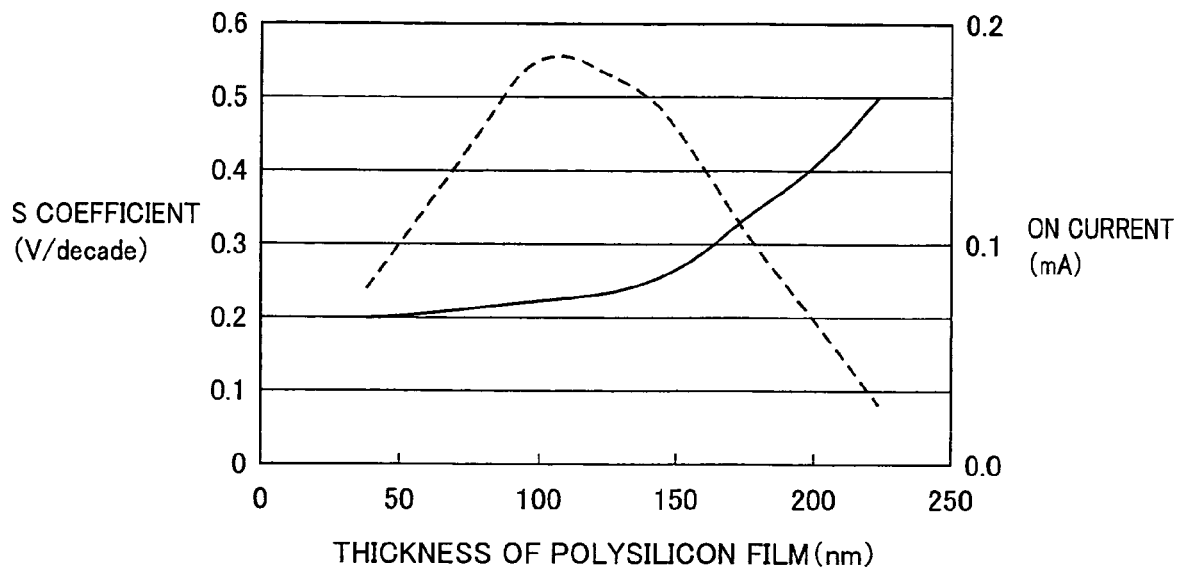
FIG. 10 is a graph showing a relation between a thickness of a polysilicon film and an S coefficient and an ON current.

In FIG. 10, the solid line represents a value of the S coefficient, and the dotted line represents a value of the ON current. Referring to FIG. 10, when the polysilicon film has a thickness not larger than 100 nm, the S coefficient indicates a substantially constant value of 0.2V/decade. On the other hand, when the polysilicon film has a thickness of 150 nm, the S coefficient slightly increases to 0.26V/decade. When the polysilicon film has a thickness of 200 nm, the S coefficient considerably increases to 0.4V/decade. The increase in the S coefficient causes increase in the threshold voltage. Therefore, if the polysilicon film has a thickness of 150 nm, the threshold voltage is set to 2.6V. If the polysilicon film has a thickness of 200 nm, the threshold voltage is set to 3.4V.

In a saturation region, the drain current is directly proportional to a square of (gate voltage—threshold voltage). Accordingly, when the gate voltage and the drain voltage are both set to 5V, the drain current decreases if polysilicon film 7 has a thickness of 200 nm. (If polysilicon film 7 has a thickness of 150 nm, the square of (gate voltage—threshold voltage) is 5.95, while if polysilicon film 7 has a thickness of 200 nm, the square of (gate voltage—threshold voltage) is 2.56. ) In addition, when polysilicon film 7 has thickness T large than 150 nm, an inversion layer is not formed entirely along a direction of thickness of channel 11 with the gate voltage being set to 5V. Accordingly, when the polysilicon film has a thickness of 100 nm, the drain current attains its maximum value. Then, when polysilicon film 7 has a thickness larger than 100 nm, the drain current gradually decreases. This phenomenon can be understood as follows.

The S coefficient can be expressed as follows:

$$S = \ln 10 \times kt/q \times (1 + Cd/Cox)$$

where k represents a Boltzmann constant, t represents an absolute temperature, Cd represents a capacitance of a channel depletion layer, and Cox represents a capacitance of the gate insulating film. As can be seen from this expression, as polysilicon film 7 has larger thickness T, capacitance of the channel depletion layer Cd is increased, resulting in the increase in the S coefficient. Increase in the S coefficient causes increase in the threshold voltage, and therefore, the drain current when the gate voltage and the drain voltage are set to the same value decreases. For these reasons, in the semiconductor device in the present embodiment, polysilicon film 7 has thickness T larger than 50 nm and not larger than 150 nm, more preferably, thickness T larger than 75 nm and not larger than 125 nm.

In this manner, in the semiconductor device shown in FIG. 1, polysilicon film 7 has a relatively large thickness, that is, larger than 50 nm. Accordingly, a large number of dangling bonds are present in polysilicon film 7, which causes deterioration of the transistor characteristic. In the semiconductor device shown in FIG. 1, in order to solve such a problem, the proportion of hydrogen contained in polysilicon film 7 is controlled to be in an appropriate range. This will be described in detail in the following.

In the semiconductor device shown in FIG. 1, the proportion of hydrogen contained in polysilicon film 7 is set to be in a range from at least 0.5 atomic percent to at most 10 atomic percent. If the proportion of hydrogen contained in polysilicon film 7 is lower than 0.5 atomic percent, the dangling bonds in polysilicon film 7 cannot sufficiently be terminated. Accordingly, lowering of the ON current or increase in the S coefficient is caused, and further disadvantageously, a leakage current increases.

In addition, if the proportion of hydrogen contained in polysilicon film 7 is higher than 10 atomic percent, excessive hydrogen decomposes $SiO_2$ for forming gate insulating film 17, to produce Si—OH and $Si^+$. As $Si^+$ forms fixed charges in gate insulating film 17, a gate withstand voltage is lowered or the threshold voltage may fluctuate due to $Si^+$. In other words, bonding reaction between excessive hydrogen and oxygen contained in the gate insulating film takes place, and semiconductor atoms in the semiconductor film are turned to ions, that are going to leave the semiconductor film. Such a semiconductor causes the above-described problem.

For the reasons above, according to the semiconductor device shown in FIG. 1 in which polysilicon film 7 contains hydrogen in a proportion not smaller than 0.5 atomic percent and not larger than 10 atomic percent, excellent ON current is obtained, and such a characteristic that the high gate voltage is attained and a variation of the threshold voltage is suppressed can be achieved.

In the semiconductor device shown in FIG. 1 in which polysilicon film 7 has thickness T of 100 nm and contains 2 atomic percent hydrogen, an electric characteristic was evaluated. As a result, an excellent ON current was obtained, variation of the threshold was not significant, and the gate withstand voltage was high.

The semiconductor device according to the first embodiment of the present invention includes glass substrate 1 serving as a substrate having main surface 1a, polysilicon film 7 serving as a semiconductor film formed on main surface 1a, having channel region 11 formed, and having source region 9 and drain region 13 formed on opposing sides of channel region 11, gate insulating film 17 formed so as to be in contact with polysilicon film 7 and containing oxygen, and gate electrode 21 provided in a position facing channel region 11 with gate insulating film 17 being interposed. Polysilicon film 7 has a thickness larger than 50 nm and not larger than 150 nm. Polysilicon film 7 contains hydrogen in a proportion not smaller than 0.5 atomic percent and not larger than 10 atomic percent.

According to the semiconductor device fabricated as above, polysilicon film 7 has a thickness larger than 50 nm and not larger than 150 nm, so that the ON current is increased and a relatively good subthreshold characteristic can be achieved. In addition, polysilicon film 7 contains hydrogen in a proportion not smaller than 0.5 atomic percent and not larger than 10 atomic percent, so that lowering of the ON current or the gate voltage is prevented and variation of the threshold value can be suppressed.

A variation of the semiconductor device shown in FIG. 1 will now be described. It is noted that the same or corresponding components have the same reference characters allotted in the semiconductor device in FIGS. 1 and 11. Therefore, detailed description of the structure common in FIGS. 1 and 11 will not be repeated.

Figure 11:
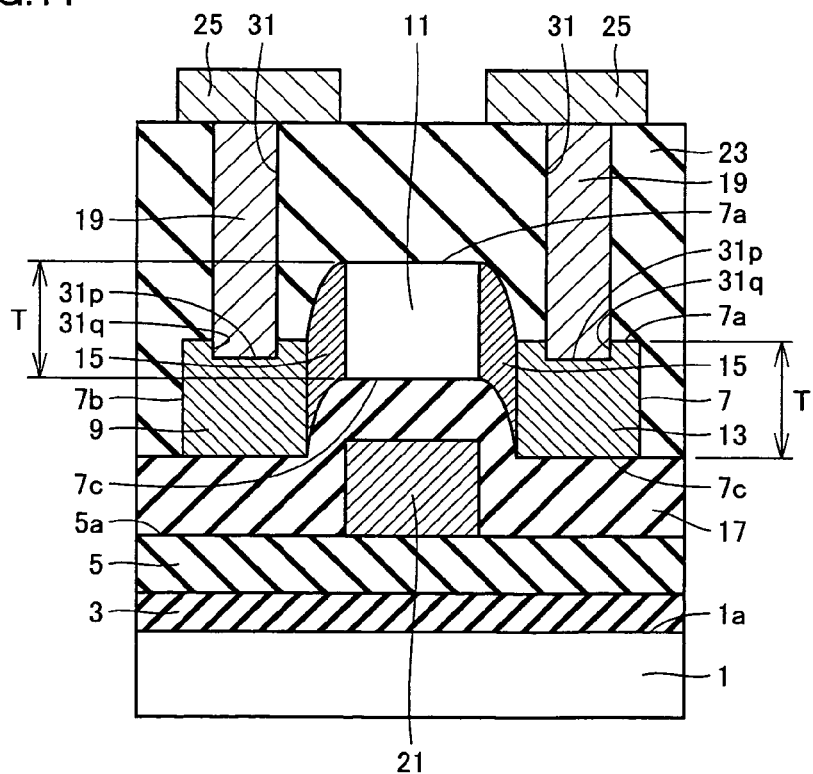
FIGS. 11 and 12 are cross-sectional views illustrating variations of the semiconductor device shown in FIG. 1.

Referring to FIG. 11, in the present variation, gate electrode 21 is disposed on top surface 5a of $SiO_2$ film 5, and gate insulating film 17 is formed to cover gate electrode 21. On gate insulating film 17, polysilicon film 7 having channel region 11 formed and having source region 9 and drain region 13 formed on opposing sides of channel region 11 is formed. Here, channel region 11 faces gate electrode 21 with gate insulating film 17 being interposed.

In the present variation, a distance between bottom surface 7c of polysilicon film 7 coming in contact with gate insulating film 17 and top surface 7a located opposite to bottom surface 7c and extending in parallel to bottom surface 7c is equal to thickness T of polysilicon film 7. In this manner, according to the semiconductor device having gate electrode 21 disposed below channel region 11, an effect the same as in the semiconductor device shown in FIG. 1 can also be obtained. It is noted that the present variation is applicable to the semiconductor device in an embodiment described later (except for the fifth embodiment).

Another variation of the semiconductor device shown in FIG. 1 will now be described. It is noted that the same or corresponding components have the same reference characters allotted in the semiconductor device in FIGS. 1 and 12. Therefore, detailed description of the structure common in FIGS. 1 and 12 will not be repeated.

Figure 12:
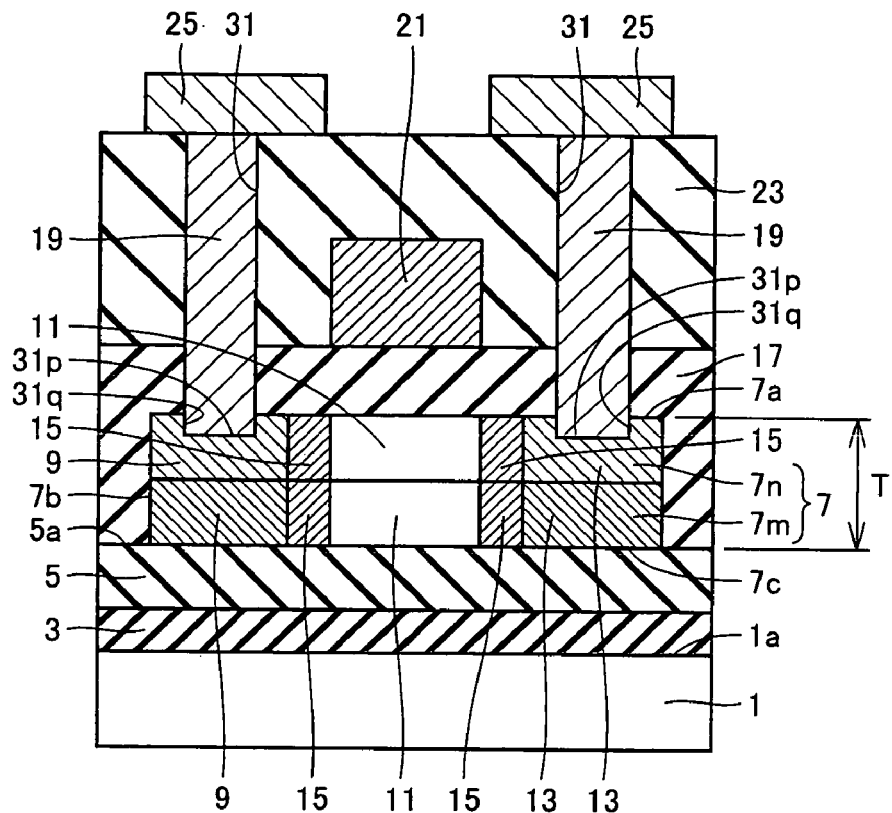

Referring to FIG. 12, in the present variation, polysilicon film 7 is constituted of a first layer 7m and a second layer 7n successively stacked on top surface 5a of $SiO_2$ film 5. Second layer 7n is provided more distant from main surface 1a than first layer 7m is. That is, in the step of manufacturing the semiconductor device shown in FIG. 3 above, it is the amorphous silicon film implementing second layer 7n that is directly irradiated with the laser beam.

Polysilicon film 7 is formed such that the proportion of hydrogen contained in first layer 7m is smaller than the proportion of hydrogen contained in second layer 7n. Here, when heat treatment for reducing an amount of hydrogen contained in amorphous silicon film 41 in the step shown in FIG. 2 above is carried out, the proportion of hydrogen in first layer 7m, from which hydrogen is less likely to escape, is set to relatively small. As such, sudden escape of a large amount of hydrogen and resultant ablation in the film can be prevented. In particular, as polysilicon film 7 is formed to have a thickness larger than 50 nm, ablation tends to occur in the film. Therefore, this variation is effective.

In addition, polysilicon film 7 may be formed such that a bandgap of first layer 7m is smaller than that of second layer 7n. Here, light is less likely to be absorbed in second layer 7n having a relatively large bandgap. Accordingly, in the laser annealing process shown in FIG. 3 above, excellent polycrystallization can be achieved in first layer 7m that laser beam is less likely to reach. In order to set bandgaps in respective layers, first layer 7m should contain hydrogen in a relatively small proportion, while second layer 7n should contain hydrogen in a relatively large proportion. Alternatively, first layer 7m should contain germanium (Ge) in a relatively small proportion, while second layer 7n should contain germanium in a relatively large proportion.

Second Embodiment

Basically, a semiconductor device according to a second embodiment of the present invention has a structure similar to that in FIG. 1. In other words, polysilicon film 7 has thickness T larger than 50 nm and not larger than 150 nm, more preferably larger than 75 nm and not larger than 125 nm. In addition, source region 9 and drain region 13 are formed from top surface 7a to bottom surface 7c of polysilicon film 7. In the semiconductor device according to the present embodiment, though polysilicon film 7 may contain hydrogen in a proportion not smaller than 0.5 atomic percent and not larger than 10 atomic percent, this is not essential. In addition, gate insulating film 17 does not necessarily have to contain oxygen.

The semiconductor device according to the present embodiment is fabricated with the method of manufacturing the semiconductor device described in the first embodiment. In addition, in the step shown in FIG. 7, the condition for injecting phosphorus to polysilicon film 7 is set as follows: ion acceleration voltage of 80 kV and dose of $2 \times 10^{15}/cm^2$ (polysilicon film 7 has thickness T of 100 nm, and gate insulating film 17 has a thickness of 80 nm). Source region 9 and drain region 13 are thus formed to reach bottom surface 7c of polysilicon film 7.

The semiconductor device according to the second embodiment of the present invention includes glass substrate 1 having main surface 1a, polysilicon film 7 formed on main surface 1a, having channel region 11 formed, and having source region 9 and drain region 13 formed on opposing sides of channel region 11, gate insulating film 17 formed so as to be in contact with polysilicon film 7, and gate electrode 21 formed in a position facing channel region 11 with gate insulating film 17 being interposed. Polysilicon film 7 has a thickness larger than 50 nm and not larger than 150 nm. Source region 9 and drain region 13 are formed so as to reach bottom surface 7c of polysilicon film 7 from top surface 7a of polysilicon film 7.

Figure 13:
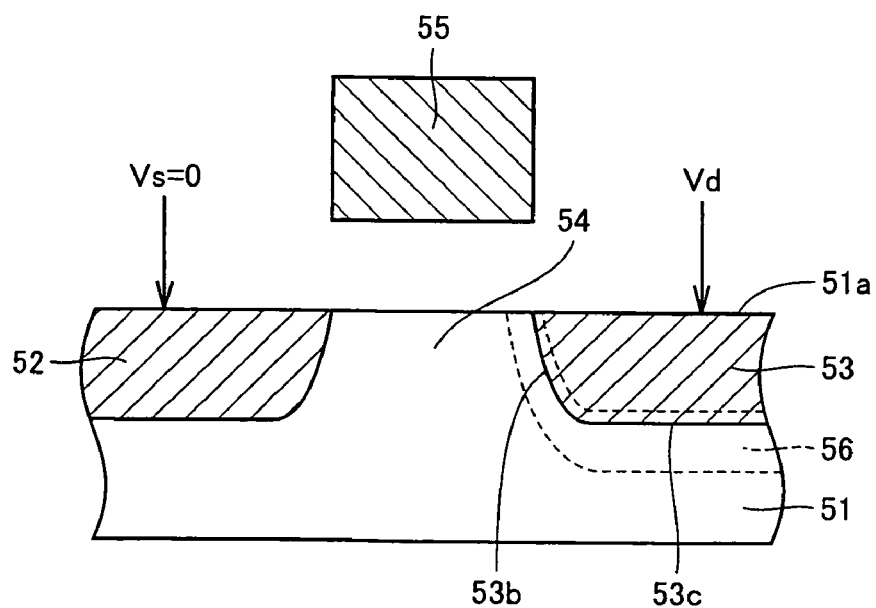
FIG. 13 is a schematic view of a semiconductor device for illustrating an effect according to a second embodiment of the present invention.

An effect achieved according to the second embodiment of the present invention will now be described. Referring to FIG. 13, a source region 52, a channel region 54, and a drain region 53 are formed. In addition, a polysilicon film 51 having a thickness larger than 50 nm and a gate electrode 55 formed in a position facing channel region 54 with a not-shown gate insulating film being interposed are shown.

If an impurity is injected under a conventional impurity injection condition to polysilicon film 51 having a thickness larger than 50 nm, source region 52 and drain region 53 are formed solely to an intermediate depth in a direction of thickness of polysilicon film 51 as shown in FIG. 13. Accordingly, the drain region defined in polysilicon film 51 has a periphery 53b extending in the direction of thickness of polysilicon film 51 and a periphery 53c extending in parallel to a top surface 51a of polysilicon film 51.

When source region 52 is connected to the ground and a voltage Vd is applied to drain region 53, a depletion layer 56 is formed in a region having a prescribed width around peripheries 53b and 53c. As periphery 53c extending in parallel to top surface 51a extends over a distance longer than periphery 53b extending in the direction of thickness of polysilicon film 51, the capacitance of the drain depletion layer is significantly increased due to presence of periphery 53c. Though increase in the capacitance of the drain depletion layer does not affect a static characteristic of the semiconductor device, it deteriorates a dynamic characteristic of the same, which results in deterioration of a fast-response characteristic of the semiconductor device. Such a problem is solved by the semiconductor device according to the present embodiment, in which source region 9 and drain region 13 are formed from top surface 7a to bottom surface 7c of polysilicon film 7 and the periphery of the drain region defined in polysilicon film 7 is present in such a manner as to extend solely in the direction of thickness of polysilicon film 7.

Therefore, according to the semiconductor device in the present embodiment, the ON current is increased and a relatively good subthreshold characteristic can effectively be achieved. In addition, an effect to maintain the fast-response characteristic of the semiconductor device can be obtained. If the semiconductor device is used in a pixel transistor in a liquid crystal display device or a driver circuit transmitting an image signal of the pixel transistor, the fast-response characteristic of the semiconductor device is strongly demanded. Therefore, the present invention is particularly effective in such a case.

Third Embodiment

Basically, a semiconductor device according to a third embodiment of the present invention has a structure similar to that in FIG. 1. In other words, polysilicon film 7 has thickness T larger than 50 nm and not larger than 150 nm, more preferably larger than 75 nm and not larger than 125 nm. In the semiconductor device according to the present embodiment, though polysilicon film 7 may contain hydrogen in a proportion not smaller than 0.5 atomic percent and not larger than 10 atomic percent, this is not essential. In addition, gate insulating film 17 does not necessarily have to contain oxygen.

Moreover, in the semiconductor device according to the present embodiment, phosphorus serving as an electrically active impurity contained in source region 9 and drain region 13 is injected such that its concentration peak value is located between top surface 7a and bottom surface 7c and the concentration at bottom surface 7c is set to at most $4 \times 10^{20}/cm^3$. This will be described in detail in the following.

As described in the first embodiment, phosphorus serving as an electrically active n-type impurity is introduced in source region 9 and drain region 13. Phosphorus is introduced using ion implantation, in addition to ion doping performed in the step shown in FIG. 7. If an amount of introduction of phosphorus is excessive, however, a resistance value of obtained source region 9 and drain region 13 becomes high. This is because phosphorus ions accelerated by a high voltage destruct crystals in source region 9 and drain region 13. If all crystals in polysilicon film 7 are destructed, the resistance value of source region 9 and drain region 13 becomes extremely high, for example, $10^7$ Ω/□ (sheet resistance value: resistivity×area into which current flows÷length over which current flows).

Here, a normal MOS transistor fabricated on a monocrystalline silicon substrate is considered. Even if crystals are destructed due to an excessively large amount of the electrically active impurity introduced in the silicon substrate using an ion implantation technique, only the surface of the silicon substrate that impurity ions reached is destructed. When heat treatment for recovering crystallinity is subsequently carried out, crystals epitaxially grow from a deep position in the non-destructed substrate toward the surface of the substrate, and the destructed region is again monocrystallized. Therefore, in the MOS transistor fabricated on the monocrystalline silicon substrate, even if a large amount of the electrically active impurity is introduced, crystallinity of the silicon substrate is not damaged so long as the heat treatment for recovering crystallinity is carried out.

In contrast, when a semiconductor film is formed on the main surface of the substrate as in the thin film transistor, an underlying portion of the semiconductor film is implemented by a glass substrate or an $SiO_2$ film without crystallinity. Accordingly, if crystallinity is impaired in all positions from the top surface to the bottom surface of the semiconductor film, crystallinity of the semiconductor film will not be recovered in spite of the subsequent heat treatment. Therefore, the resistance value of the obtained source region 9 and drain region 13 becomes high.

Figure 14:
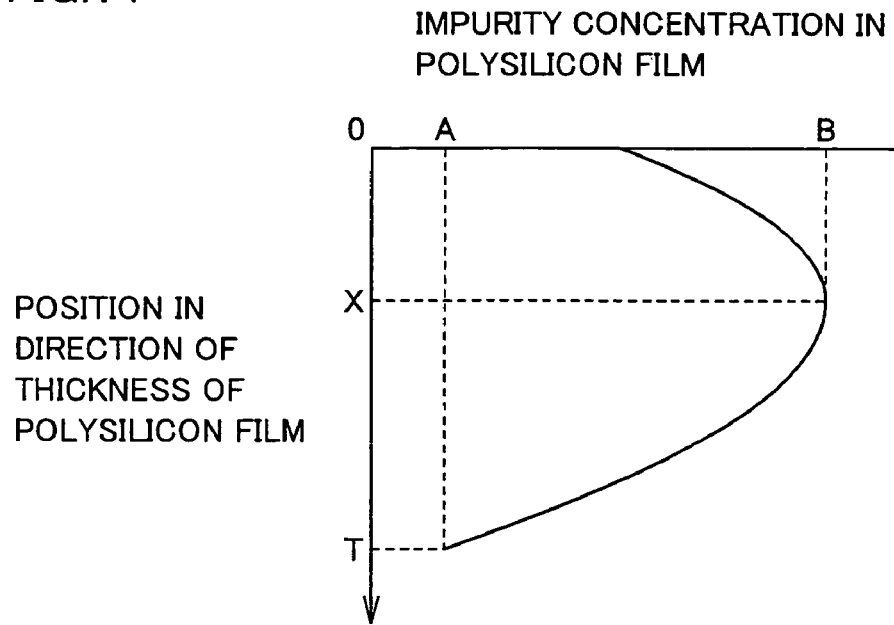
FIG. 14 is a graph showing a relation between a position in a direction of thickness of the polysilicon film and a concentration of an impurity contained at each position in a semiconductor device according to a third embodiment of the present invention.

Referring to FIG. 14, the 0 position on the ordinate coincides with the position of top surface 7a of polysilicon film 7, while the T position on the ordinate coincides with the position of bottom surface 7c of polysilicon film 7. The impurity concentration increases as the position is located away from top surface 7a, and attains a peak value B at a position located away from top surface 7a by X. When the position is located further away from top surface 7a, the impurity concentration starts to decrease, and attains a value A not larger than $4\times10^{20}/cm^3$ at bottom surface 7c.

In the semiconductor device according to the present embodiment, by setting the impurity concentration at bottom surface 7c within the range described above, destruction of crystals of polysilicon film 7 in all positions in the direction of thickness is avoided. Therefore, the resistance value of source region 9 and drain region 13 can be suppressed to low level.

On the other hand, if the impurity concentration at bottom surface 7c is set to value A described above with polysilicon film 7 having a small thickness, the position away from top surface 7a by X, at which the impurity concentration attains peak value B, may be present above top surface 7a, that is, inside gate insulating film 17. In the semiconductor device according to the present embodiment, however, polysilicon film 7 has a relatively large thickness, that is, a thickness larger than 50 nm and not larger than 150 nm. Therefore, in the semiconductor device according to the present embodiment, the position at which the impurity concentration attains peak value B is present in polysilicon film 7. In this manner, the impurity concentration in polysilicon film 7 can be set to a high value.

In addition, as polysilicon film 7 has a relatively large thickness, contact hole 31 can readily be formed in such a manner that bottom surface 31p is defined in polysilicon film 7, without penetrating the same. Therefore, contact plug 19 filling contact hole 31 comes in contact with polysilicon film 7 not only on the side surface but also on the bottom surface. For these reasons, the contact resistance between contact plug 19 and polysilicon film 7 can sufficiently be lowered.

Peak value B of the impurity concentration is preferably set to $1\times10^{20}/cm^3$ or larger. Here, a contact resistance between contact plug 19 and polysilicon film 7 can further effectively be lowered.

The semiconductor device according to the present embodiment was fabricated with the method of manufacturing the semiconductor device described in the first embodiment. Here, in the step shown in FIG. 7, the condition for injecting phosphorus to polysilicon film 7 was set as follows: ion acceleration voltage of 80 kV and dose of $2\times10^{15}/cm^2$. After the semiconductor device was fabricated, the semiconductor device was evaluated. Impurity concentration A at bottom surface 7c of source region 9 and drain region 13 attained $3.4\times10^{19}/cm^3$. In addition, the position at which the impurity concentration attains its peak was present at a position located away from top surface 7a by X=8 nm, and peak value B of the impurity concentration at that position attained $1.9\times10^{20}/cm^3$. The measured sheet resistance value of source region 9 and drain region 13 was as low as 2500 Ω/□.

The sheet resistance value of source region 9 and drain region 13 was measured for various thicknesses T of polysilicon film 7 in a range from larger than 50 nm to not larger than 150 nm. As a result, it was confirmed that, with any thickness, crystals in polysilicon film 7 were not destructed and the sheet resistance value of source region 9 and drain region 13 was low by setting the impurity concentration at bottom surface 7c to $4\times10^{20}/cm^3$ or smaller. In addition, it was also confirmed that a similar result was obtained even when boron (B) or arsenic (As) instead of phosphorus was employed as the impurity to be introduced.

It is noted that a lamp annealing process (rapid heat treatment) at a temperature of 600° C. for approximately 1 minute, for example, may be added to the method of manufacturing the semiconductor device described in the first embodiment, in order to recover crystallinity of polysilicon film 7.

The semiconductor device according to the third embodiment of the present invention includes glass substrate 1 having main surface 1a, polysilicon film 7 formed on main surface 1a, having channel region 11 formed, and having source region 9 and drain region 13 formed on opposing sides of channel region 11, gate insulating film 17 provided so as to be in contact with polysilicon film 7, and gate electrode 21 formed in a position facing channel region 11 with gate insulating film 17 being interposed. Polysilicon film 7 has a thickness larger than 50 nm and not larger than 150 nm. Source region 9 and drain region 13 contain phosphorus serving as the impurity in a concentration varied along the direction of thickness of polysilicon film 7. The peak value of the impurity concentration is present between top surface 7a and bottom surface 7c of polysilicon film 7. The impurity concentration at bottom surface 7c of polysilicon film 7 is set to $4\times10^{20}/cm^3$ or smaller.

According to the semiconductor device fabricated as above, the ON current is increased and a relatively good subthreshold characteristic can effectively be achieved. In addition, an effect to lower the contact resistance between contact plug 19 and polysilicon film 7 can be obtained.

Fourth Embodiment

Figure 15:
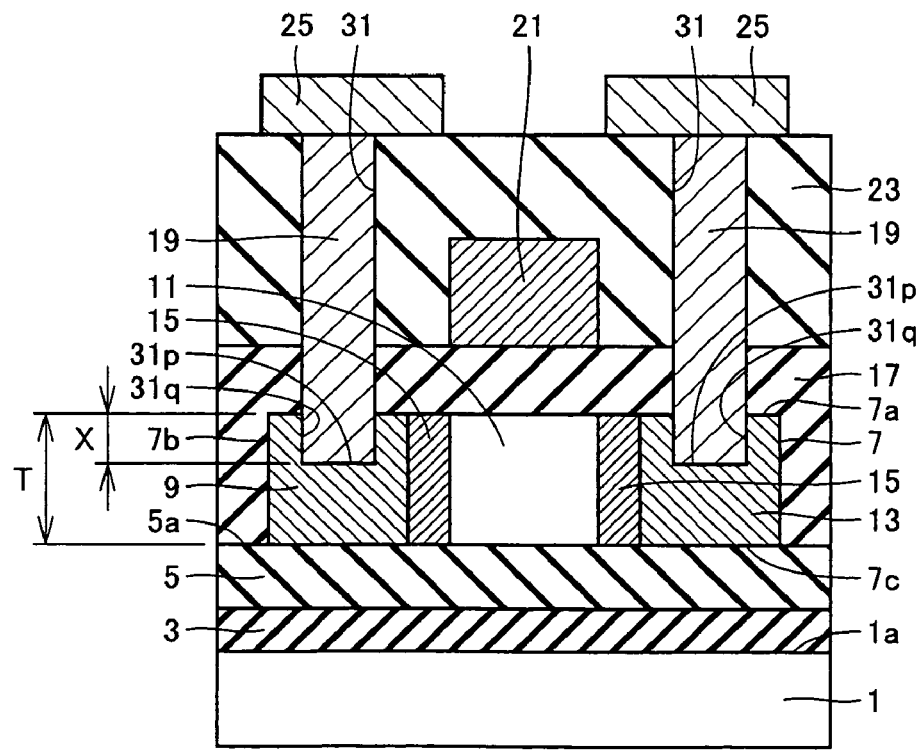
FIG. 15 is a cross-sectional view showing a semiconductor device according to a fourth embodiment of the present invention.

It is noted that the same or corresponding components have the same reference characters allotted in the semiconductor device in FIGS. 1 and 15.

Referring to FIG. 15, basically, a semiconductor device according to the present embodiment has a structure similar to that described in the third embodiment. In other words, polysilicon film 7 has thickness T larger than 50 nm and not larger than 150 nm, more preferably larger than 75 nm and not larger than 125 nm. In addition, phosphorus serving as the electrically active impurity contained in source region 9 and drain region 13 is injected such that the peak value of the concentration thereof is present between top surface 7a and bottom surface 7c. It is noted that the concentration of phosphorus at bottom surface 7c does not necessarily have to be set to $4\times10^{20}/cm^3$ or smaller.

In addition, in the semiconductor device according to the present embodiment, the position at which the concentration of phosphorus injected to source region 9 and drain region 13 attains a peak value substantially coincides with the position of bottom surface 31p of contact hole 31. In other words, if it is assumed that the position at which the concentration of phosphorus attains the peak value is present in a position away from top surface 7a by X also in the present embodiment as shown in FIG. 14, bottom surface 31p is formed also in a position away from top surface 7a by X. It is noted that the meaning of the phrase "to substantially coincide" covers not only exact coincidence of these positions but also coincidence of these positions within a margin of 10% of thickness T of polysilicon film 7. When polysilicon film 7 has thickness T of 100 nm, for example, and the positions are displaced from each other within a margin of 10 nm, the positions substantially coincide with each other.

Consequently, contact plug 19 filling contact hole 31 comes in contact with polysilicon film 7 at a position at which the concentration of phosphorus attains the peak value. Therefore, the contact resistance between contact plug 19 and polysilicon film 7 can sufficiently be lowered.

The semiconductor device according to the fourth embodiment of the present invention includes glass substrate 1 having main surface 1a, polysilicon film 7 formed on main surface 1a, having channel region 11 formed, and having source region 9 and drain region 13 formed on opposing sides of channel region 11, gate insulating film 17 provided so as to be in contact with polysilicon film 7, and gate electrode 21 provided in a position facing channel region 11 with gate insulating film 17 being interposed. Polysilicon film 7 has a thickness larger than 50 nm and not larger than 150 nm. Source region 9 and drain region 13 have contact holes 31 formed respectively. Here, the contact hole is opened in top surface 7a of polysilicon film 7 and has bottom surface 31p within polysilicon film 7. The semiconductor device further includes contact plug 19 serving as a conductor film filling contact hole 31. Source region 9 and drain region 13 contain phosphorus serving as an impurity having a concentration varied along the direction of thickness of polysilicon film 7. The position at which the peak value of the impurity concentration is located substantially coincides with the position at which bottom surface 31p of contact hole 31 is located.

According to the semiconductor device fabricated as above, the ON current is increased and a relatively good subthreshold characteristic can effectively be achieved. In addition, an effect to lower the contact resistance between contact plug 19 and polysilicon film 7 can be obtained.

Fifth Embodiment

Figure 16:
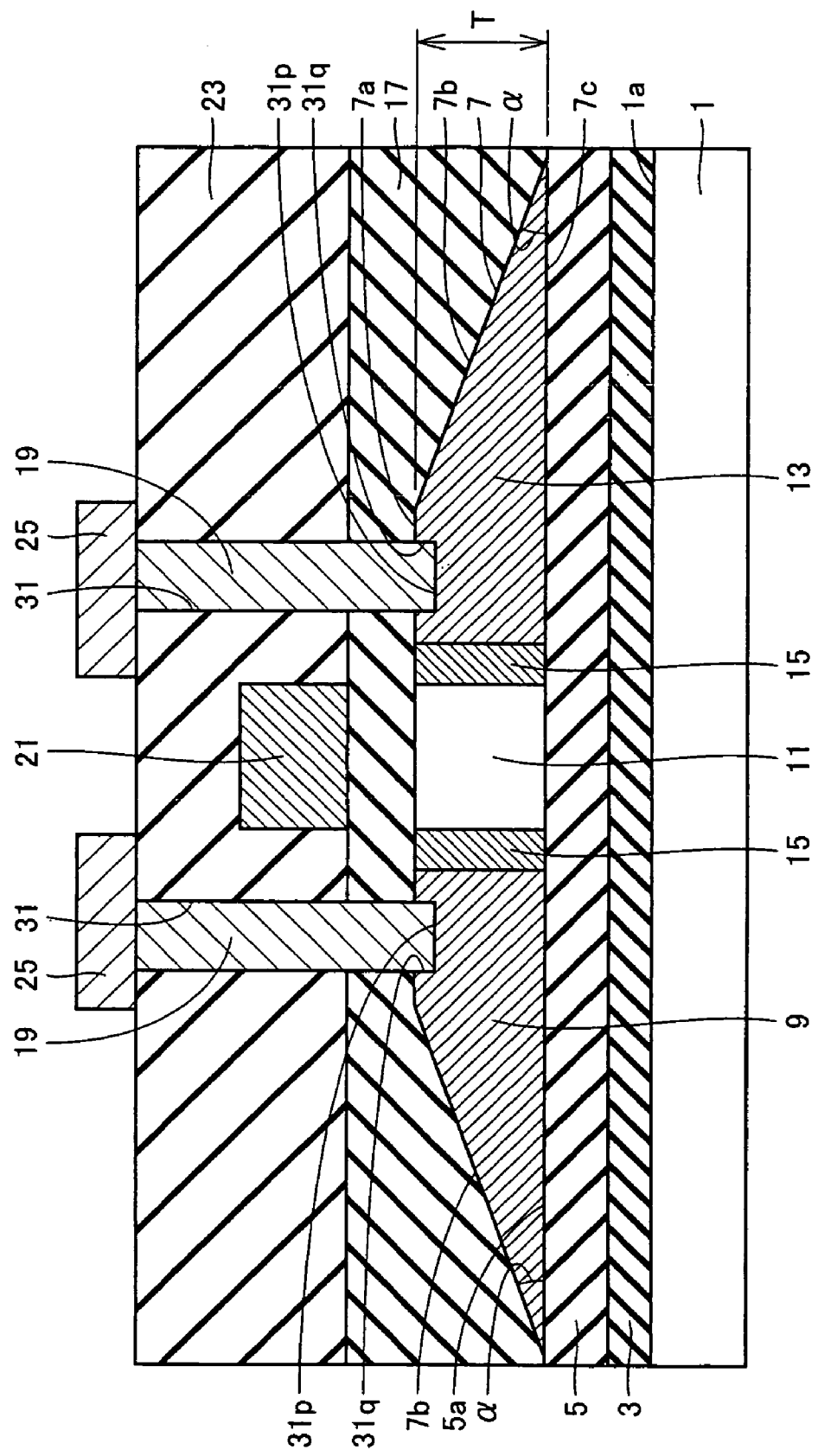
FIG. 16 is a cross-sectional view showing a semiconductor device according to a fifth embodiment of the present invention.

It is noted that the same or corresponding components have the same reference characters allotted in the semiconductor device in FIGS. 1 and 16.

Referring to FIG. 16, basically, a semiconductor device according to the present embodiment has a structure similar to that described in the first embodiment. In other words, polysilicon film 7 has thickness T larger than 50 nm and not larger than 150 nm, more preferably larger than 75 nm and not larger than 125 nm. In the semiconductor device according to the present embodiment, though polysilicon film 7 may contain hydrogen in a proportion not smaller than 0.5 atomic percent and not larger than 10 atomic percent, this is not essential. In addition, gate insulating film 17 does not necessarily have to contain oxygen.

In addition, in the semiconductor device according to the present embodiment, polysilicon film 7 is formed such that an angle α (hereinafter, also referred to as a tapered angle α) between bottom surface 7c and side surface 7b of polysilicon film 7 is set to be in a range from at least 5° to at most 45°. In the present embodiment, tapered angle α is set to 20°. Tapered angle α refers to an angle formed inside polysilicon film 7. Tapered angle α refers to an angle between the top surface of the underlying layer of polysilicon film 7 coming in contact with bottom surface 7c, that is, top surface 5a of $SiO_2$ film 5 in the present embodiment, and side surface 7b. If the underlying layer of polysilicon film 7 is not provided, tapered angle α refers to an angle between main surface 1a of glass substrate 1 coming in contact with bottom surface 7c and side surface 7b.

In the semiconductor device shown in FIG. 16 fabricated as above, tapered angle α is set to be in a range from at least 5° to at most 45°. Therefore, while suppressing an extremely large size of the semiconductor device, performance in covering polysilicon film 7 with gate insulating film 17 can be improved. This will be described in detail in the following.

In the thin film transistor, a temperature during the process of the same cannot be set to a temperature of 550° C. or higher due to the restriction that the glass substrate is used. This is because the glass substrate deforms at a temperature of 550° C. or higher. Accordingly, in general, an $SiO_2$ film fabricated at a low temperature from approximately 300° C. to 400° C. using plasma CVD is used as the gate insulating film. Actually, in the semiconductor device shown in FIG. 16, gate insulating film 17 is formed with $SiO_2$ fabricated at a temperature of 350° C.

On the other hand, the $SiO_2$ film fabricated using plasma CVD is disadvantageous in its poor performance in covering a stepped portion. Accordingly, if polysilicon film 7 is formed such that side surface 7b orthogonally intersects with bottom surface 7c, the gate insulating film tends to have a thickness in positions covering opposing ends of polysilicon film 7 smaller than in a position covering top surface 7a thereof.

Such a tendency is particularly noticeable when polysilicon film 7 has a relatively large thickness, that is, a thickness larger than 50 nm. For example, when polysilicon film 7 having thickness T of 150 nm is formed to have tapered angle α of 90° and the $SiO_2$ film having a thickness of 50 nm is formed on polysilicon film 7 using plasma CVD, the $SiO_2$ film has a smallest thickness of 10 nm in positions covering the opposing ends of polysilicon film 7. As a withstand voltage of gate electrode 21 and the source electrode (gate withstand voltage) is determined by the thickness of gate insulating film 17, the gate withstand voltage is lowered when the $SiO_2$ film has a small thickness in the positions covering the opposing ends of polysilicon film 7.

Figure 17:
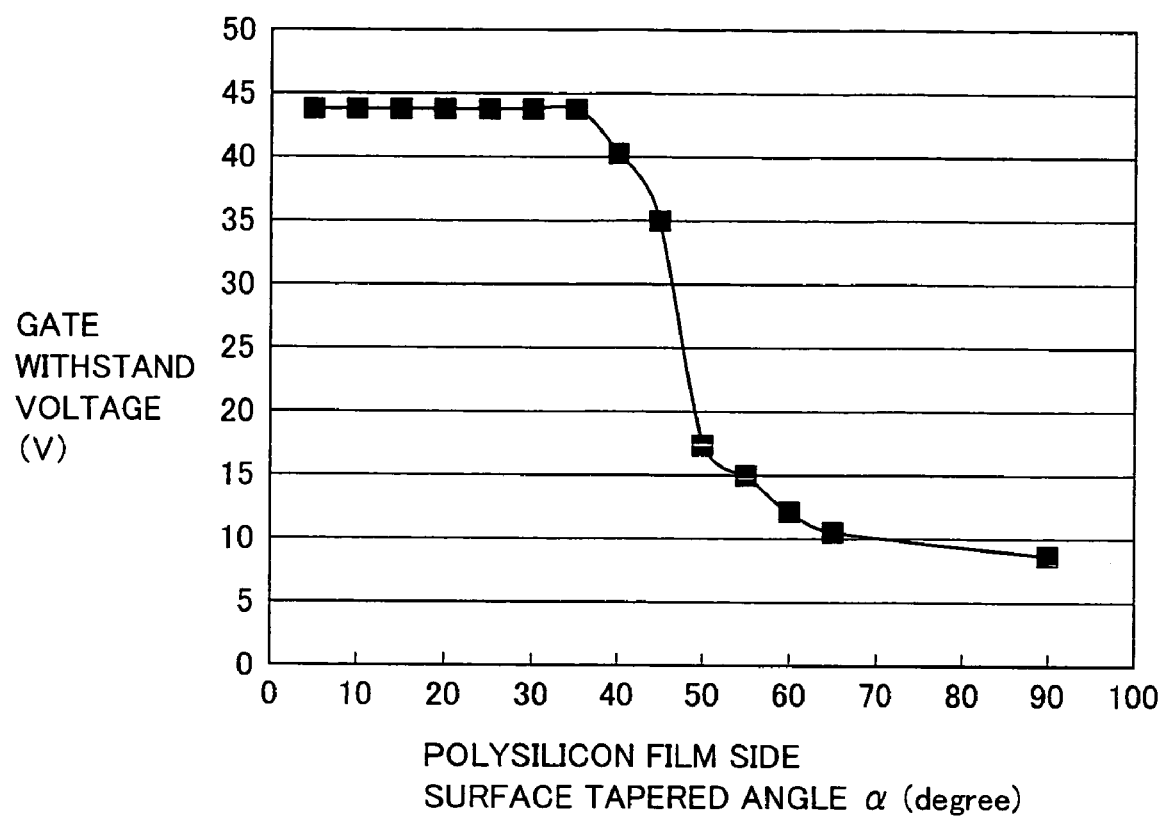
FIG. 17 is a graph showing a relation between a polysilicon film side surface tapered angle α and a gate withstand voltage.

FIG. 17 shows a relation between polysilicon film side surface tapered angle α and the gate withstand voltage when polysilicon film 7 has thickness T of 150 nm and gate insulating film 17 ($SiO_2$ film) has a thickness of 50 nm in the semiconductor device shown in FIG. 16. Referring to FIG. 17, it can be seen that the gate withstand voltage is significantly lowered when tapered angle α is set to 50° or larger. Normally, an application voltage of the thin film transistor used in the liquid crystal display device is set to 10V, and in actual use, it is necessary to secure a margin of approximately 10V for the application voltage. Therefore, tapered angle α should be set to 45° or smaller, preferably 35° or smaller.

If gate insulating film 17 has a large thickness of 80 nm, for example, in spite of tapered angle α set to 50° or larger, the gate withstand voltage may be set to 20V or higher. In such a case, however, the ON current decreases for the following reasons.

In a saturation region, a drain current (ON current) Id can be expressed as follows:

$$Id = W\mu Cox(Vg-Vth)^2/(2L)$$

where W represents a gate width, μ represents mobility, Vg represents a gate voltage, Vth represents a threshold voltage, L represents a gate length, and Cox represents a gate insulating film capacitance per a unit area. Assuming that the thickness of the gate insulating film ($SiO_2$ film) is denoted by d, relative dielectric constant of $SiO_2$ is denoted by ∈s, and vacuum dielectric constant is denoted by ∈O, the following equation holds.

$$Cox = \epsilon O \cdot \epsilon s/d$$

Therefore, it can be seen that the ON current is lowered with the increase in the thickness of the gate insulating film. Increase in the thickness of gate insulating film 17 results in impairment of the effect obtained by setting thickness T of polysilicon film 7 to a value larger than 50 nm. This is not practical because the characteristic of the thin film transistor is deteriorated.

On the other hand, even if tapered angle α less than 5°, the gate withstand voltage is not lowered. If tapered angle α is set to less than 5°, however, a length of side surface 7b (length in a direction of the gate length) when side surface 7b of polysilicon film 7 is projected on main surface 1a of glass substrate 1 becomes considerably large. This fact causes a larger size of the thin film transistor, and higher integration becomes difficult. Therefore, such a setting is not practical.

In the semiconductor device shown in FIG. 16, when a length in a direction of the gate width of top surface 7a is set to 10 μm and a length in a direction of the gate length thereof is set to 15 μm, for example, polysilicon film 7 has a size of 150 μm² (10 μm×15 μm) with tapered angle α being set to 90°. If it is assumed that polysilicon film 7 having a thickness of 150 nm is formed with tapered angle α being set to 5° in the semiconductor device, the length of side surface 7b when side surface 7b is projected on main surface 1a attains 1.7 μm and an area of side surface 7b attains 17 m² (10 μm×1.7 μm). That is, an area of side surface 7b as a total of both of the source and drain sides attains 34 μm². As compared with an example where tapered angle α is set to 90°, the size of polysilicon film 7 is increased by 22.7%.

In addition, if it is assumed that polysilicon film 7 having a thickness of 150 nm is formed with tapered angle α being set to 4°, an area of side surface 7b when side surface 7b is projected on main surface 1a attains 42 μm² (2×10 μm×2.1 μm) as a total of both of the source and drain sides. That is, as compared with the example where tapered angle α is set to 90°, the size of polysilicon film 7 is increased by approximately 28%. For practical use, increase in the size of polysilicon film 7 should be suppressed to approximately 25% or lower. Therefore, tapered angle α is set to 5° or larger.

Moreover, gate insulating film 17 preferably has a thickness not smaller than 10 nm and not larger than 100 nm. If gate insulating film 17 has a thickness larger than 100 nm, lowering in the ON current is significant. If gate insulating film 17 has a thickness smaller than 10 nm, the electric field generated at the time of application of voltages of 0V and 5V to the source electrode and the gate electrode respectively cannot be suppressed to 5MV/cm or smaller, which results in lower reliability of the semiconductor device. Therefore, gate insulating film 17 preferably has the thickness in the above-mentioned range.

The method of manufacturing the semiconductor device shown in FIG. 16 is basically similar to that described in the first embodiment. In the step shown in FIG. 4, however, dry etching with resist-retreating method using an RIE (reactive ion etching) mode is performed in order to form inclined side surface 7b. An angle of inclination of side surface 7b is controlled by mixed ratio (oxygen flow rate) of an etching gas used in the etching process. When polysilicon film 7 is formed such that tapered angle α is set to 20°, for example, a gas mixture consisting of $CF_4$ and $O_2$ of which flow rates are set to 200 cm³/min (sccm) and 100 cm³/min (sccm) respectively is employed, a gas pressure is set to 15 Pa, and RF power is set to 1500 W.

The semiconductor device according to the fifth embodiment of the present invention includes glass substrate 1 having main surface 1a, polysilicon film 7 formed on main surface 1a, having channel region 11 formed, and having source region 9 and drain region 13 formed on opposing sides of channel region 11, gate insulating film 17 provided on polysilicon film 7 and covering polysilicon film 7, and gate electrode 21 provided on polysilicon film 7 in a position facing channel region 11 with gate insulating film 17 being interposed. Polysilicon film 7 has a thickness larger than 50 nm and not larger than 150 nm. Polysilicon film 7 has top surface 7a and bottom surface 7c as well as side surface 7b continuing from top surface 7a to bottom surface 7c. An angle between bottom surface 7c and side surface 7b is not smaller than 5° and not larger than 45°.

According to the semiconductor device fabricated as above, the ON current is increased and a relatively good subthreshold characteristic can effectively be achieved. In addition, an effect to improve performance in covering polysilicon film 7 with gate insulating film 17 while suppressing an extremely large size of the semiconductor device can be obtained.

It is noted that the semiconductor device may be implemented by combining the semiconductor devices according to the first to fifth embodiments as appropriate. In this case, a combined effect of those in the embodiments described above can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a substrate having a main surface;
   a semiconductor film provided on said main surface, having a channel region formed and having a source region and a drain region formed on opposing sides of said channel region, and having a thickness of larger than 50 nm and at most 150 nm;
   a gate insulating film provided so as to be in contact with said semiconductor film and containing oxygen; and
   a gate electrode provided in a position facing said channel region with said gate insulating film being interposed; wherein
   said semiconductor film contains hydrogen in a proportion of at least 0.5 atomic percent and at most 10 atomic percent, and wherein said semiconductor film has lightly doped drain regions formed between the channel region and the source and drain regions, and wherein
said semiconductor film has first and second layers successively stacked on said main surface, and
said first layer contains hydrogen in a proportion smaller than a proportion in said second layer.

2. The semiconductor device according to claim 1, wherein said semiconductor film has a thickness of larger than 75 nm and at most 125 nm.

3. The semiconductor device according to claim 1, wherein said substrate is a glass substrate or a quartz substrate.

4. The semiconductor device according to claim 1, wherein said semiconductor film includes polycrystalline silicon.

5. A semiconductor device comprising:
a substrate having a main surface;
a semiconductor film provided on said main surface, having a channel region formed and having a source region and a drain region formed on opposing sides of said channel region, and having a thickness of larger than 50 nm and at most 150 nm;
a gate insulating film provided so as to be in contact with said semiconductor film and containing oxygen; and
a gate electrode provided in a position facing said channel region with said gate insulating film being interposed; wherein
said semiconductor film contains hydrogen in a proportion of at least 0.5 atomic percent and at most 10 atomic percent, and wherein said semiconductor film has lightly doped drain regions formed between the channel region and the source and drain regions, and
wherein
said semiconductor film has first and second layers successively stacked on said main surface, and
said first layer has a bandgap smaller than a bandgap of said second layer.

6. The semiconductor device according to claim 5, wherein said semiconductor film has a thickness of larger than 75 nm and at most 125 nm.

7. The semiconductor device according to claim 5, wherein said substrate is a glass substrate or a quartz substrate.

8. The semiconductor device according to claim 5, wherein said semiconductor film includes polycrystalline silicon.

9. A semiconductor device, comprising:
a substrate having a main surface;
a semiconductor film provided on said main surface, having a channel region formed and having a source region and a drain region formed on opposing sides of said channel region, and having a thickness of larger than 50 nm and at most 150 nm, and wherein said semiconductor film has lightly doped drain regions formed between the channel region and the source and drain regions;
a gate insulating film provided so as to be in contact with said semiconductor film; and
a gate electrode provided in a position facing said channel region with said gate insulating film being interposed; wherein
said source region and said drain region have contact holes formed respectively, the contact holes being opened in a top surface of said semiconductor film and having a bottom surface within said semiconductor film at a distance from said top surface of said semiconductor film,
said semiconductor device further comprises a conductor film respectively filling said contact holes,
said source region and said drain region contain an impurity in a concentration continuously varied along a direction of the thickness of said semiconductor film, and
a position at which a peak value of the concentration of said impurity is located substantially coincides with a position at which the bottom surface of said contact holes are located such that said conductor film filling said contact holes respectively contacts said source region and said drain region at the position at which the peak value of the concentration of said impurity is located.

10. The semiconductor device according to claim 9, wherein
said peak value of the concentration of said impurity is at least $1 \times 10^{20}/cm^3$.

11. The semiconductor device according to claim 9, wherein said semiconductor film has a thickness of larger than 75 nm and at most 125 nm.

12. The semiconductor device according to claim 9, wherein said substrate is a glass substrate or a quartz substrate.

13. The semiconductor device according to claim 9, wherein said semiconductor film includes polycrystalline silicon.

14. A semiconductor device, comprising:
a substrate having a main surface;
a semiconductor film provided on said main surface, having a channel region formed and having a source region and a drain region formed on opposing sides of said channel region, and having a thickness of larger than 75 nm and at most 150 nm, and wherein said semiconductor film has lightly doped drain regions formed between the channel region and the source and drain regions;
a gate insulating film provided on said semiconductor film and covering said semiconductor film; and
a gate electrode provided on said semiconductor film and formed in a position facing said channel region with said gate insulating film being interposed; wherein
said semiconductor film has a top surface and a bottom surface, and a side surface located in a length direction of the gate electrode continuing from said top surface to said bottom surface,
an angle between said bottom surface and said side surface is set to at least 5° and at most 45°,
said source region and said drain region have contact holes formed therein respectively, the contact holes being opened in said top surface of said semiconductor film, and the contact holes having a bottom surface within said semiconductor film at a distance from said top surface of said semiconductor film,
said semiconductor device further comprises a conductor film respectively filling said contact holes,
said source region and said drain region contain an impurity in a concentration continuously varied along a direction of the thickness of said semiconductor film, and
a position at which a peak value of the concentration of said impurity is located substantially coincides with a position at which the bottom surface of said contact holes are located such that said conductor film filling said contact holes respectively contacts said source region and said drain region at the position at which the peak value of the concentration of said impurity is located.

15. The semiconductor device according to claim 14, wherein said gate insulating film has a thickness of at least 10 nm and at most 100 nm.

16. The semiconductor device according to claim 14, wherein said semiconductor film has a thickness of larger than 75 nm and at most 125 nm.

17. The semiconductor device according to claim 14, wherein said substrate is a glass substrate or a quartz substrate.

18. The semiconductor device according to claim 14, wherein said semiconductor film includes polycrystalline silicon.

* * * * *